United States Patent
Froehlich et al.

(10) Patent No.: US 11,139,335 B2
(45) Date of Patent: Oct. 5, 2021

(54) ASSEMBLY FOR DETECTING ELECTROMAGNETIC RADIATION AND METHOD OF PRODUCING AN ASSEMBLY FOR DETECTING ELECTROMAGNETIC RADIATION

(71) Applicant: ams International AG, Rapperswil (CH)

(72) Inventors: Thomas Froehlich, Ottikon bei Kemptthal (CH); Michael Leitner, Kainbach (AT); Thomas Troxler, Erlenbach (CH); Josef Pertl, Graz (AT); Dominik Hollinger, Meilen (CH); Thomas Mueller, Eschenbach (CH); Andreas Fitzi, Staefa (CH); Jens Hofrichter, Horgen (CH)

(73) Assignee: AMS INTERNATIONAL AG, Rapperswil (CH)

( * ) Notice: Subject to any disclaimer, the term of this patent is extended or adjusted under 35 U.S.C. 154(b) by 61 days.

(21) Appl. No.: 16/637,883

(22) PCT Filed: Jul. 26, 2018

(86) PCT No.: PCT/EP2018/070313
§ 371 (c)(1),
(2) Date: Feb. 10, 2020

(87) PCT Pub. No.: WO2019/034388
PCT Pub. Date: Feb. 21, 2019

(65) Prior Publication Data
US 2020/0168657 A1 May 28, 2020

(30) Foreign Application Priority Data
Aug. 14, 2017 (EP) .................................... 17186179

(51) Int. Cl.
*H01L 27/146* (2006.01)

(52) U.S. Cl.
CPC .. *H01L 27/14661* (2013.01); *H01L 27/14634* (2013.01); *H01L 27/14687* (2013.01); *H01L 27/14689* (2013.01)

(58) Field of Classification Search
CPC ......... H01L 27/14634; H01L 27/14661; H01L 27/14687; H01L 27/14689
See application file for complete search history.

(56) References Cited

U.S. PATENT DOCUMENTS 6,476,867 B1    11/2002  Kobayashi et al.
8,461,541 B2 *   6/2013  Garcia .............. H01L 27/14683
                                                  250/370.01
(Continued)

FOREIGN PATENT DOCUMENTS

EP    0762504    3/1997
EP    1168450    1/2002
(Continued)

OTHER PUBLICATIONS

Chinese Office Action in corresponding Chinese Application No. 2020-506989 dated Feb. 9, 2021, 9 pages.
(Continued)

*Primary Examiner* — David A Zarneke
(74) *Attorney, Agent, or Firm* — MH2 Technology Law Group LLP

(57) ABSTRACT

The assembly comprises a semiconductor device with an active-pixel array, a readout circuit chip or plurality of readout circuit chips mounted outside the active-pixel array, the readout circuit chip or plurality of readout circuit chips being configured to read out voltages or currents provided by the active-pixel array, and electric connections between the active-pixel array and the readout circuit chip or plurality of readout circuit chips.

19 Claims, 1 Drawing Sheet

(56) References Cited

U.S. PATENT DOCUMENTS

| | | |
|---|---|---|
| 2008/0083939 A1 | 4/2008 | Guidash |
| 2016/0127668 A1 | 5/2016 | Fujita et al. |
| 2017/0025453 A1* | 1/2017 | Bornfreund ....... H01L 27/14634 |

FOREIGN PATENT DOCUMENTS

| | | |
|---|---|---|
| EP | 1756874 | 12/2009 |
| JP | 2003204057 A | 7/2003 |
| JP | 2008053286 A | 3/2008 |
| JP | 2012118060 A | 6/2012 |
| JP | 2014220370 A | 11/2014 |
| JP | 2015099131 A | 5/2015 |
| WO | 2005/117145 | 12/2005 |

OTHER PUBLICATIONS

Bushberg, J. T. et al.: "The Essential Physics of Medical Imaging" ISBN 13: 9781451118100, Wolters Kluwer Health, Publisher: Lippincott Williams & Wilkins, pp. 220-222.

European Patent Office, International Search Report for PCT/EP2018/070313 dated Oct. 4, 2018.

Jang, H. et al.: "Hole based CMOS Active Pixel Sensor for Medical X-ray Imaging" 2011 IEEE Nuclear Science Symposium Conference Record.

Karim, S. K. et al.: "Amorphous Silicon Active Pixel Sensor Readout Circuit for Digital Imaging" IEEE Transactions on Electron Devices, vol. 50, No. 1, Jan. 2003.

Oike, Y. et al.: "An 8.3M-pixel 480fps Global-Shutter CMOS Image Sensor with Gain-Adaptive Column ADCs and 2-on-1 Stacked Device Structure" 2016 Symposium on VLSI Circuits Digest of Technical Papers.

* cited by examiner

ASSEMBLY FOR DETECTING ELECTROMAGNETIC RADIATION AND METHOD OF PRODUCING AN ASSEMBLY FOR DETECTING ELECTROMAGNETIC RADIATION The present disclosure is related to the field of detection of electromagnetic radiation, especially X-radiation, by semiconductor devices.

BACKGROUND OF THE INVENTION

In medical applications of X-radiation, an X-ray tube is employed in combination with a flat panel detector for indirect detection. A scintillator converts X-radiation into visible light, which is then converted by means of photodiodes and readout circuits into a digital code.

A passive type of flat panel detector comprises an array of photodiodes formed in amorphous silicon to generate charge. Each pixel has a thin-film transistor, which is activated to read out the stored charges row by row. Column readout circuits, which are connected to the edge of the panel, convert the charge into a digital code. Large parasitic capacitances and high on-resistances of the thin-film transistors adversely affect the read-out speed and the noise performance of this type of flat panel detector.

Read-out speed and noise performance can be enhanced by integrating the readout circuits on the same wafer together with the pixel array, thus forming an active-pixel sensor. Active-pixel sensors on mono-crystalline silicon comprising complementary metal oxide semiconductor (CMOS) components are employed in cell phone cameras or web cameras, for instance, and are produced using CMOS technology.

Active-pixel sensors on amorphous silicon panels are used in some flat panel detectors and result in slight performance improvements over pure passive panels at relatively low cost compared to CMOS active-pixel sensors. However, thin-film transistors in amorphous silicon have the disadvantage of lower transconductance and higher flicker noise compared to transistors on crystalline silicon wafers.

SUMMARY OF THE INVENTION

The definitions as described above also apply to the following description unless stated otherwise.

The assembly for detecting electromagnetic radiation comprises a semiconductor device with a main surface, an active-pixel array at the main surface, a readout circuit chip or plurality of readout circuit chips mounted on the main surface outside the active-pixel array, the readout circuit chip or plurality of readout circuit chips being configured to read out voltages or currents provided by the active-pixel array, and electric connections between the active-pixel array and the readout circuit chip or plurality of readout circuit chips.

The semiconductor device comprises a semiconductor wafer, and the active-pixel array is integrated in the wafer. The semiconductor wafer can especially be mono-crystalline.

In an embodiment the semiconductor wafer has a maximum of four interconnect layers consisting of metal or poly-silicon.

In further embodiments the active-pixel array comprises NMOS transistors, PMOS transistors or both NMOS and PMOS transistors. Each pixel of the active-pixel array may be provided with at least three transistors. The number of transistors of each pixel may be limited to twenty active transistors.

Further embodiments comprise further transistors of the readout circuit chip or plurality of readout circuit chips, the transistors of the active-pixel array having a transistor feature size that is at least equal to or larger than the corresponding transistor feature size of the further transistors. The ratio between the transistor feature sizes of the active-pixel array and the readout circuits may even be larger than two.

In an alternative embodiment the active-pixel array comprises transistors in a technology node characterized in that it comprises structures with feature sizes larger or equal to 250 nm.

In further embodiments the electric connections between the active-pixel array and the readout circuit chip or plurality of readout circuit chips comprise solder balls or solder bumps, and/or wires.

Further embodiments comprise a board with electric interconnections, and the semiconductor device is mounted on the board and electrically connected to the electric interconnections. Solder balls or solder bumps and/or wires can be provided for these electric connections. The board may especially be a printed circuit board.

In further embodiments wires electrically connect the semiconductor device to the readout circuit chip or plurality of readout circuit chips and/or to the electric interconnections of the board.

The method of producing an assembly for detecting electromagnetic radiation comprises integrating an active-pixel array on a semiconductor wafer, thus forming a semiconductor device, providing a readout circuit chip or plurality of readout circuit chips, mounting the readout circuit chip or plurality of readout circuit chips on the periphery of the semiconductor device outside the area of the active-pixel array, and forming electric connections between the active-pixel array and the readout circuit chip or plurality of readout circuit chips.

A mono-crystalline raw wafer can be used in the method as a start material. The active-pixel array is formed at a main surface of the raw wafer. The wafer may be singulated in later processing steps to form individual semiconductor chips or dies. The semiconductor device thus obtained optionally covers more than 30% of the entire original area of the main surface. The semiconductor device may instead cover more than 50% of the surface area.

The semiconductor device can be formed by a CMOS or NMOS or PMOS manufacturing process, for instance.

BRIEF DESCRIPTION OF THE DRAWINGS

The following is a detailed description of the assembly and the method in conjunction with the appended figures.

DETAILED DESCRIPTION

Figure 1:
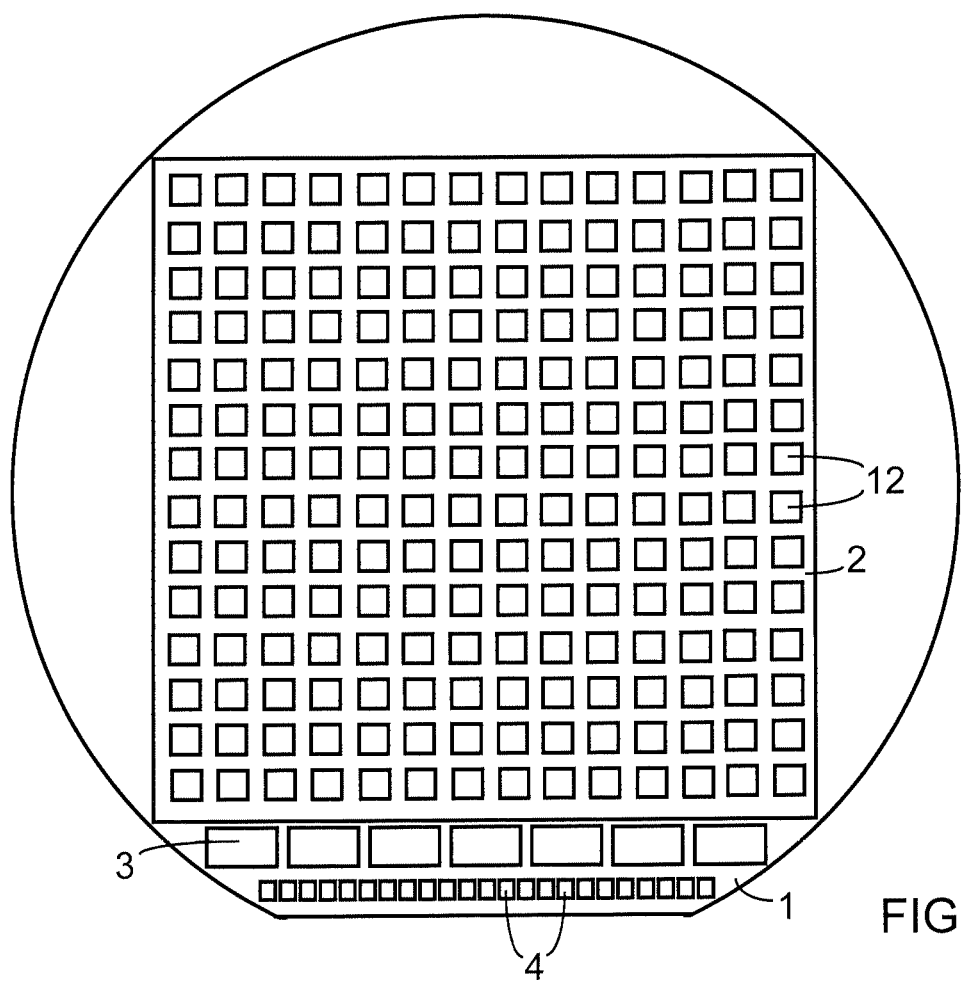
FIG. 1 is a top view of a wafer-scale imaging sensor.

FIG. 1 is a top view of a semiconductor device 1 comprising an active-pixel array 2. Each pixel 12 is provided with a photodetector and with an active component, which provides a voltage or current depending on the response of the photodetector to incident radiation. Readout circuit chips 3 are mounted on the periphery of the semiconductor device 1 outside the area of the active-pixel array 2. Bondpads 4 may optionally be provided for external electric connections. The semiconductor device 1 may especially comprise a mono-crystalline wafer, in which the components of the active pixels 12 are integrated.

Figure 2:
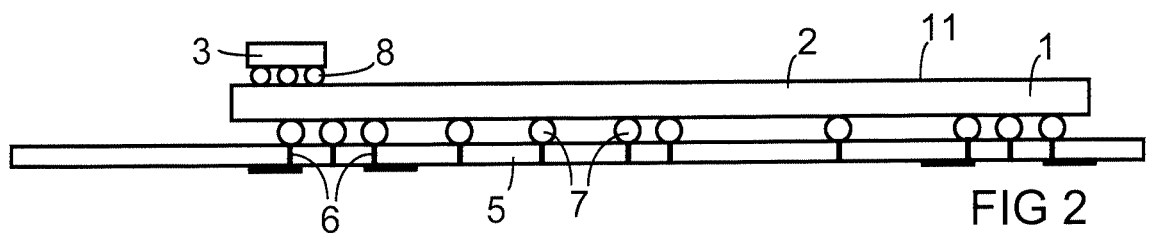
FIG. 2 is a cross section of an assembly of a wafer-scale imaging sensor comprising solder ball connections.

FIG. 2 is a cross section of an embodiment of the assembly. The semiconductor device 1 is mounted on a board 5 with electric interconnections 6. The board 5 may be a printed circuit board, for instance, and may be provided with a backside redistribution layer, which is schematically indicated in FIG. 2 by way of example. In the embodiment according to FIG. 2, solder balls 7 (or solder bumps) are provided as electric connections between the semiconductor device 1 and the electric interconnections 6 of the board 5. The readout circuit chips 3 are electrically connected to the semiconductor device 1 by further solder balls 8 (or solder bumps).

Figure 3:
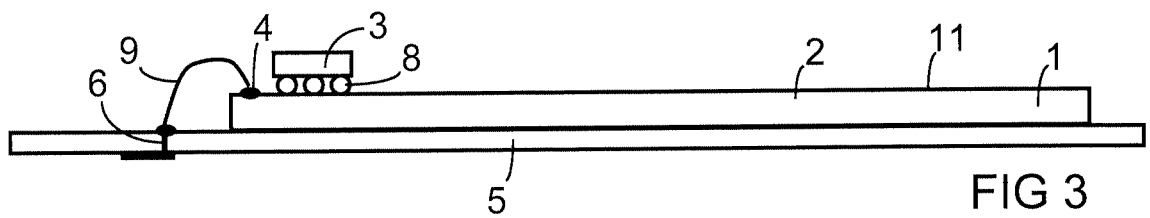
FIG. 3 is a cross section of a further assembly of a wafer-scale imaging sensor comprising connections by solder balls and wires.

FIG. 3 is a cross section of a further embodiment of the assembly. It differs from the embodiment according to FIG. 2 in the electric connections between the semiconductor device 1 and the electric interconnections 6 of the board 5. Wires 9 are provided for the electric connections instead of solder balls. The wires 9 are connected to the bondpads 4 of the semiconductor device 1.

Figure 4:
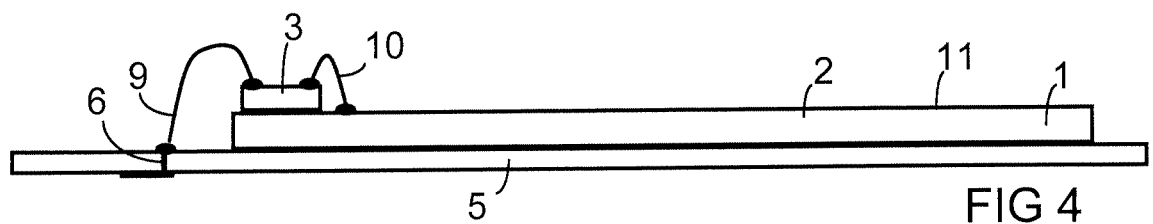
FIG. 4 is a cross section of a further assembly of a wafer-scale imaging sensor comprising wire connections.

FIG. 4 is a cross section of a further embodiment of the assembly. It differs from the embodiments according to FIGS. 2 and 3 in the electric connections between the semiconductor device 1 and the readout circuit chips 3. Wires 10 are provided for the electric connections instead of solder balls. The wires 10 are connected to the bondpads 4 of the semiconductor device 1. FIG. 4 also shows that the electric connections to the electric interconnections 6 of the board 5 may be provided by wires 9 that are electrically connected to the readout circuit chips 3.

In the method of producing the assembly for detecting electromagnetic radiation, an active-pixel array is processed on a semiconductor wafer, in particular on a mono-crystalline wafer, which may be silicon, for instance. In another embodiment, the wafer may be made from gallium arsenide (GaAs). Also, a wafers made from germanium, selenium, indium phosphide or indium gallium arsenide may be contemplated. Each pixel is provided with a photodetector, which may comprise one or more photodiodes, for instance, and at least one active component, in particular one or more transistors, to provide a voltage or current for readout. It may suffice to produce only NMOS transistors and at least two interconnection layers consisting of metal or polysilicon.

Bondpads for final bonding to a printed circuit board can be formed on the same wafer, as well as bondpads for interconnections to the readout circuit chips, according to the embodiments described above. Depending on the die-to-wafer bonding technology that is used to mount the readout circuit chips 3 on the semiconductor device 1, further process steps like plating of bondpads, for instance, may be required.

Semiconductor chips providing the readout circuits, which optionally have mixed-signal properties, can be manufactured in a standard process, especially in a standard CMOS process, especially in silicon. The readout circuits can be simpler than readout circuits for flat panel detectors in amorphous silicon panels, because the pixels are active and therefore provide a voltage or current rather than a charge. Flip-chip assembly or other die-to-wafer bonding technologies, such as wire bonding, for instance, can be used to mount the readout circuit chips 3 to the semiconductor wafer of the semiconductor device 1.

The wafer can then be sawn along boundaries of the active-pixel array 2 to obtain straight edges allowing to closely assemble the semiconductor device 1 to neighbouring devices and thus to form a larger panel. If the active-pixel array 2 covers a rectangular area and the readout circuit chips 3 are arranged near one of the sides of the rectangle, the wafer can be truncated at the three other sides. Optionally, the fourth side, where the readout circuit chips 3 are arranged, can also be sawn to allow easier bonding to the board 5 and to achieve a smaller form factor. In particular, the semiconductor device 1 thus obtained may have lateral dimensions that extend over more than 30% of the main surface area of the original (raw) wafer.

The semiconductor device 1 can be manufactured in a wafer-level low-cost manufacturing process. Standard stepper or scanner lithography can be used, however it is also possible to employ very cost-effective contact or proximity lithography. A CMOS process can be used to produce both NMOS and PMOS transistors, but it may suffice to produce either NMOS transistors or PMOS transistors. The device structures may have a feature size (especially a transistor feature size) larger than 250 nm ("quarter-micron process"), for instance, or a feature size (especially a transistor feature size) larger than 500 nm ("half-micron process"). The photodetectors may be any conventional photodetectors and may especially comprise at least one photodiode, which may comprise an n-implant region and a p-implant region. At least one implant region of the photodiode may be in contact with the main surface 11. The photodiode may be a pinned photodiode, for instance, but also other photodiode variants may be contemplated. For example, also a partially pinned photodiode may be employed.

The readout circuit chips 3 can also be manufactured by a CMOS process. At least one transistor feature size of the readout circuit chips 3 may especially be smaller than a corresponding transistor feature size of the semiconductor device 1. The feature size of the semiconductor device 1 may be at least equal to the corresponding feature size of the readout circuit chips 3. Instead, the ratio of the feature size of the semiconductor device 1 and the corresponding feature size of the readout circuit chips 3 may be larger than two.

The method may be implemented e.g. by an assembly according to the embodiments described above.

The assembly can especially be used in an X-ray detector, and in particular for imaging in medical applications.

The described wafer-scale sensor enables to improve the performance of the entire imaging system, compared to the use of thin-film transistors in amorphous silicon, and to obtain a substantial reduction of the production cost, compared to conventional wafer-scale solutions. If contact or proximity lithography is employed, the manufacturing process is much more cost-efficient than production methods resorting to stitching.

The invention claimed is:

1. An assembly for detecting electromagnetic radiation, comprising:
   a semiconductor device with a main surface, the semiconductor device comprising a semiconductor wafer,
   an active-pixel array at the main surface, the active-pixel array being integrated in the semiconductor wafer,
   a readout circuit chip or plurality of readout circuit chips mounted on the periphery of the main surface outside the area of the active-pixel array, the readout circuit chip or plurality of readout circuit chips being configured such as to read out voltages or currents provided by the active-pixel array, and electric connections between the active-pixel array and the readout circuit chip or plurality of readout circuit chips.

2. The assembly of claim 1, wherein the semiconductor wafer is mono-crystalline.

3. The assembly of claim 1, wherein the semiconductor wafer has a maximum of four interconnect layers comprising metal or polysilicon.

4. The assembly of claim 1, wherein the active-pixel array comprises NMOS transistors, PMOS transistors or both NMOS and PMOS transistors.

5. The assembly of claim 1, wherein each pixel of the active-pixel array comprises at least three transistors.

6. The assembly of claim 1, wherein each pixel of the active-pixel array comprises at most twenty active transistors.

7. The assembly of claim 4, further comprising:
further transistors of the readout circuit chip or plurality of readout circuit chips, the transistors of the active-pixel array having a transistor feature size that is at least equal to or larger than a corresponding transistor feature size of the further transistors.

8. The assembly of claim 4, further comprising:
further transistors of the readout circuit chip or plurality of readout circuit chips, the transistors of the active-pixel array having a transistor feature size that is at least twice as large as the corresponding transistor feature size of the further transistors.

9. The assembly of claim 1, wherein the electric connections between the active-pixel array and the readout circuit chip or plurality of readout circuit chips comprise solder balls.

10. The assembly of claim 1, wherein the electric connections between the active-pixel array and the readout circuit chip or plurality of readout circuit chips comprise wires.

11. The assembly of claim 1, further comprising:
a board with electric interconnections, the semiconductor device being mounted on the board and electrically connected to the electric interconnections.

12. The assembly of claim 11, further comprising:
solder balls or solder bumps electrically connecting the semiconductor device to the electric interconnections of the board.

13. The assembly of claim 11, further comprising:
wires electrically connecting the semiconductor device to the readout circuit chip or plurality of readout circuit chips and/or to the electric interconnections of the board.

14. A method of producing an assembly for detecting electromagnetic radiation, the method comprising:
integrating an active-pixel array on a semiconductor wafer, thus forming a semiconductor device,
providing a readout circuit chip or plurality of readout circuit chips,
mounting the readout circuit chip or plurality of readout circuit chips on the periphery of the semiconductor device outside the area of the active-pixel array, and
forming electric connections between the active-pixel array and the readout circuit chip or plurality of readout circuit chips.

15. The method of claim 14, wherein a mono-crystalline wafer is used as the semiconductor wafer, and the semiconductor device is formed covering more than 30% of an entire area of a main surface of the wafer.

16. The method of claim 14, wherein the semiconductor device is formed by a CMOS process.

17. The method of claim 14, wherein the semiconductor device is formed by a NMOS process.

18. The method of claim 14, wherein the semiconductor device is formed by a PMOS process.

19. The method of claim 14, wherein contact or proximity lithography is employed in the manufacturing process.

* * * * *